(12) United States Patent
Chatterjee

(10) Patent No.: US 9,219,006 B2
(45) Date of Patent: Dec. 22, 2015

(54) FLOWABLE CARBON FILM BY FCVD HARDWARE USING REMOTE PLASMA PECVD

(71) Applicant: Applied Materials, Inc., Santa Clara, CA (US)

(72) Inventor: Amit Chatterjee, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 69 days.

(21) Appl. No.: 14/153,807

(22) Filed: Jan. 13, 2014

(65) Prior Publication Data

US 2015/0200125 A1 Jul. 16, 2015

(51) Int. Cl.
*H01L 21/316* (2006.01)
*H01L 21/764* (2006.01)
*H01L 21/768* (2006.01)

(52) U.S. Cl.
CPC ........ *H01L 21/764* (2013.01); *H01L 21/76876* (2013.01)

(58) Field of Classification Search
CPC ....... H01L 21/316; H01L 21/31; H01L 21/24; H01L 21/30
USPC ......... 438/627, 763, 765, 761, 786, 791, 787, 438/778, 758, 788, 774
See application file for complete search history.

(56) References Cited

U.S. PATENT DOCUMENTS

| | | | |
|---|---|---|---|
| 8,318,584 B2 | 11/2012 | Li et al. | |
| 8,449,942 B2 | 5/2013 | Liang et al. | |
| 8,557,712 B1 | 10/2013 | Antonelli et al. | |
| 2003/0232495 A1* | 12/2003 | Moghadam et al. | 438/623 |
| 2004/0038513 A1 | 2/2004 | Kohl et al. | |
| 2011/0034035 A1* | 2/2011 | Liang et al. | 438/761 |
| 2012/0003840 A1 | 1/2012 | Wang et al. | |
| 2012/0070957 A1 | 3/2012 | Mallick et al. | |
| 2013/0217239 A1 | 8/2013 | Mallick et al. | |

OTHER PUBLICATIONS

PCT Notification of Transmittal of the International Search Report and the Written Opinion of the International Searching Authority for International Application No. PCT/US2014/070108 dated Mar. 31, 2015; 9 total pages.

* cited by examiner

*Primary Examiner* — Chuong A Luu
(74) *Attorney, Agent, or Firm* — Patterson & Sheridan, LLP

(57) ABSTRACT

Embodiments of the present invention generally relate to methods for forming a flowable carbon-containing film on a substrate. In one embodiment, an oxygen-containing gas is flowed into a remote plasma region to produce oxygen-containing plasma effluents, and a carbon-containing gas is combined with the oxygen-containing plasma effluents in a substrate processing region which contains the substrate. A carbon-containing film is formed in trenches which are formed on the substrate and a low K dielectric material is deposited on the carbon-containing film in the trenches. The carbon-containing film is decomposed by an UV treatment and airgaps are formed in the trenches under the low K dielectric material.

20 Claims, 3 Drawing Sheets

FLOWABLE CARBON FILM BY FCVD HARDWARE USING REMOTE PLASMA PECVD

BACKGROUND

1. Field

Embodiments of the present invention generally relate to methods for forming a flowable carbon-containing film on a semiconductor substrate.

2. Description of the Related Art

Semiconductor device geometries have dramatically decreased in size since their introduction several decades ago. Modern semiconductor fabrication equipment routinely produce devices with 45 nm, 32 nm, and 28 nm feature sizes, and new equipment is being developed and implemented to make devices with even smaller geometries. The decreasing feature sizes result in structural features on the device having decreased width. The widths of gaps and trenches on the devices are narrow such that filling the gap with dielectric material becomes more challenging. The depositing dielectric material is prone to clog at the top before the gap completely fills, producing a void or seam in the middle of the gap.

Over the years, many techniques have been developed to avoid having dielectric material clog the top of a gap, or to "heal" the void or seam that has been formed. One approach has been to start with carbon-containing flowable material that may be applied in a liquid phase to a spinning substrate surface (e.g., SOG deposition techniques). After removing solvent, a carbon-containing film is formed in the trenches. The carbon is then removed from the film to form air gaps inside the trenches. However, the carbon in the carbon-containing film formed by SOG deposition techniques is very difficult to remove.

Therefore, an improve method for forming a flowable carbon-containing film on a substrate is needed.

SUMMARY

Embodiments of the present invention generally relate to methods for forming a flowable carbon-containing film on a substrate. In one embodiment, an oxygen-containing gas flows into a remote plasma region to produce oxygen-containing plasma effluents, and a carbon-containing gas is combined with the oxygen-containing plasma effluents in a substrate processing region which contains the substrate. A carbon-containing film is formed in trenches which are formed on the substrate and a low K dielectric material is deposited on the carbon-containing film in the trenches. The carbon-containing film is decomposed by an UV treatment and airgaps are formed in the trenches under the low K dielectric material.

In one embodiment, a method for forming airgaps in trenches formed on a substrate is disclosed. The method includes forming a flowable carbon-containing film in a first portion of the trenches, which includes providing a carbon-containing gas to a substrate processing region in a chemical vapor deposition chamber, providing an oxygen-containing gas to a remote plasma system to form oxygen-containing plasma effluents, introducing the plasma effluents into the substrate processing region, and reacting the plasma effluents and the carbon-containing gas to form the flowable carbon-containing film in the first portion of the trenches. The method further includes forming a low K dielectric material on the flowable carbon-containing film in a second portion of the trenches, and removing the flowable carbon-containing film to form the airgaps in the first portion of the trenches.

In another embodiment, a method for forming airgaps in trenches formed on a substrate is disclosed. The method includes forming a flowable poly(methyl methacrylate) film in a first portion of the trenches, which includes providing a methyl methacrylate gas to a substrate processing region in a chemical vapor deposition chamber, forming an argon and oxygen-containing plasma effluents in a plasma region distinct from the substrate processing region in the chemical vapor deposition chamber, introducing the plasma effluents into the substrate processing region, and reacting the plasma effluents and the methyl methacrylate gas to form the flowable poly(methyl methacrylate) film in the first portion of the trenches. The method further includes removing the flowable poly(methyl methacrylate) film to form the airgaps in the first portion of the trenches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods for forming a flowable carbon-containing film on a substrate. In one embodiment, an oxygen-containing gas is flowed into a remote plasma region to produce oxygen-containing plasma effluents, and a carbon-containing gas is combined with the oxygen-containing plasma effluents in a substrate processing region which contains the substrate. A carbon-containing film is formed in trenches which are formed on the substrate and a low K dielectric material is deposited on the carbon-containing film in the trenches. The carbon-containing film is decomposed by an UV treatment and airgaps are formed in the trenches under the low K dielectric material.

Figure 1:
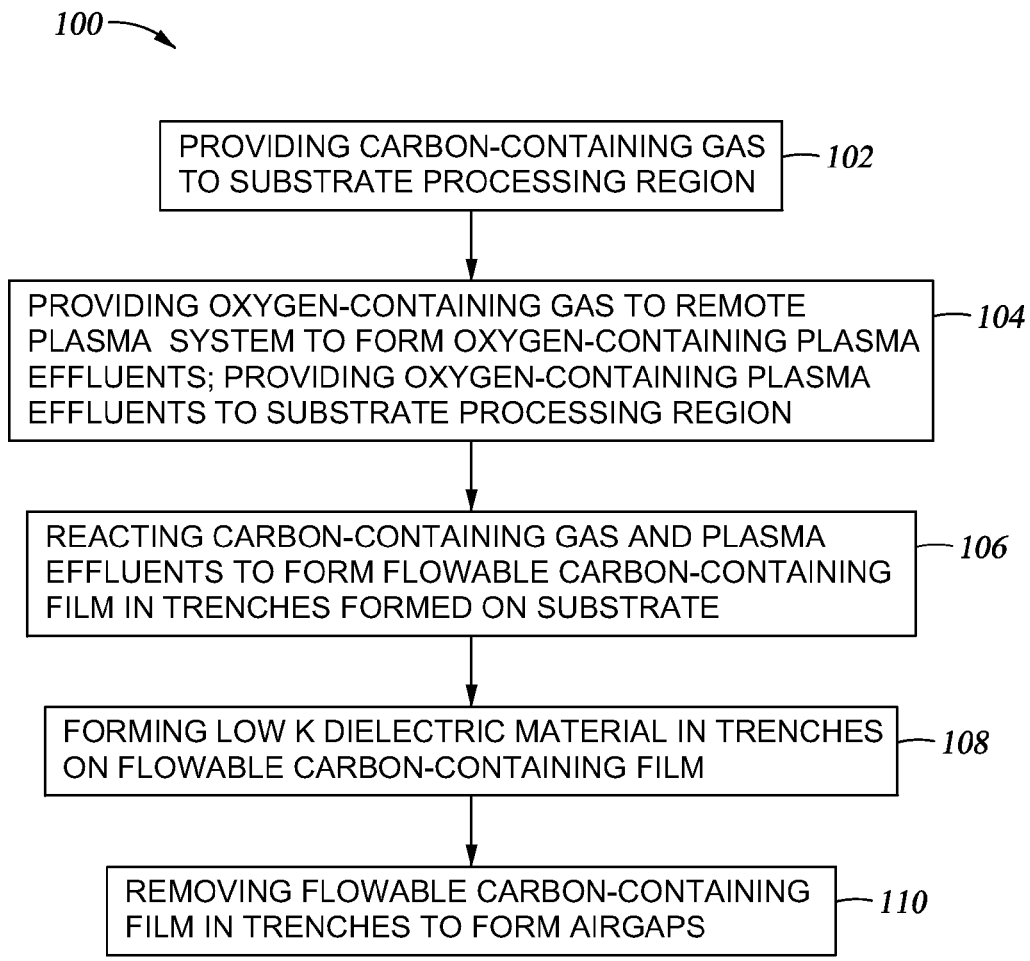
FIG. 1 is a flowchart illustrating a method for forming airgaps in trenches formed on a substrate according to one embodiment.

FIG. 1 is a flowchart 100 illustrating a method for forming airgaps in trenches formed on a substrate according to one embodiment for a 300 mm diameter wafer. At block 102, a carbon-containing precursor gas is introduced to a substrate processing region of a chemical vapor deposition (CVD) chamber. The carbon-containing precursor gas may be a carbon-containing monomer such as methyl methacrylate (MMA) and may have a flow rate of 400 to 600 standard cubic centimeters per minute (sccm). In one embodiment, the carbon-containing precursor gas does not contain silicon. The carbon-containing precursor gas may be introduced to the substrate processing region through a dual-zone showerhead.

In addition to the carbon-containing precursor gas, oxygen-containing plasma effluents are also introduced to the substrate processing region of the CVD chamber, at block 104. In one embodiment, the oxygen-containing plasma effluents also include argon plasma effluents. The oxygen and argon-containing plasma effluents are formed by flowing an oxygen and argon-containing gas, such as a mixture of oxygen and argon gases, through a remote plasma system. In one embodiment, the oxygen gas has a flow rate of 100 sccm and the argon gas has a flow rate of 1000 to 2000 sccm. The oxygen and argon-containing gas may be energized by a plasma formed in the remote plasma system positioned outside or inside the CVD chamber. The oxygen and argon-containing gas may be excited in a plasma region inside the CVD chamber. This plasma region may be partitioned from the substrate processing region. The oxygen and argon-containing gas may be exposed to the remote plasma where it is dissociated, radicalized, and/or otherwise transformed into the oxygen and argon-containing plasma effluents. The plasma effluents formed in the plasma region are then introduced to the substrate processing region through the dual-zone showerhead.

Next, at block 106, the oxygen-containing plasma effluents react with the carbon-containing precursor gas in the substrate processing region to form a flowable carbon-containing film in trenches formed on a substrate. The reaction may occur at room temperature, such as 20 degrees Celsius. In the embodiment where MMA is used as the carbon-containing gas, flowable poly(methyl methacrylate) (PMMA) is formed in the trenches.

The flowable carbon-containing film only fills a portion of each trench, and the remaining portion of each trench is filled with a low K dielectric material, such as carbon doped silicon oxide. At block 108, the low K dielectric material is deposited on the carbon-containing film in the trenches. Next, at block 110, the flowable carbon-containing film inside each trench is removed by an ultraviolent (UV) treatment, leaving airgaps formed in the bottom portion of the trenches. The flowable PMMA film deposited as described above is relatively easy to remove with UV treatment.

Figure 2:
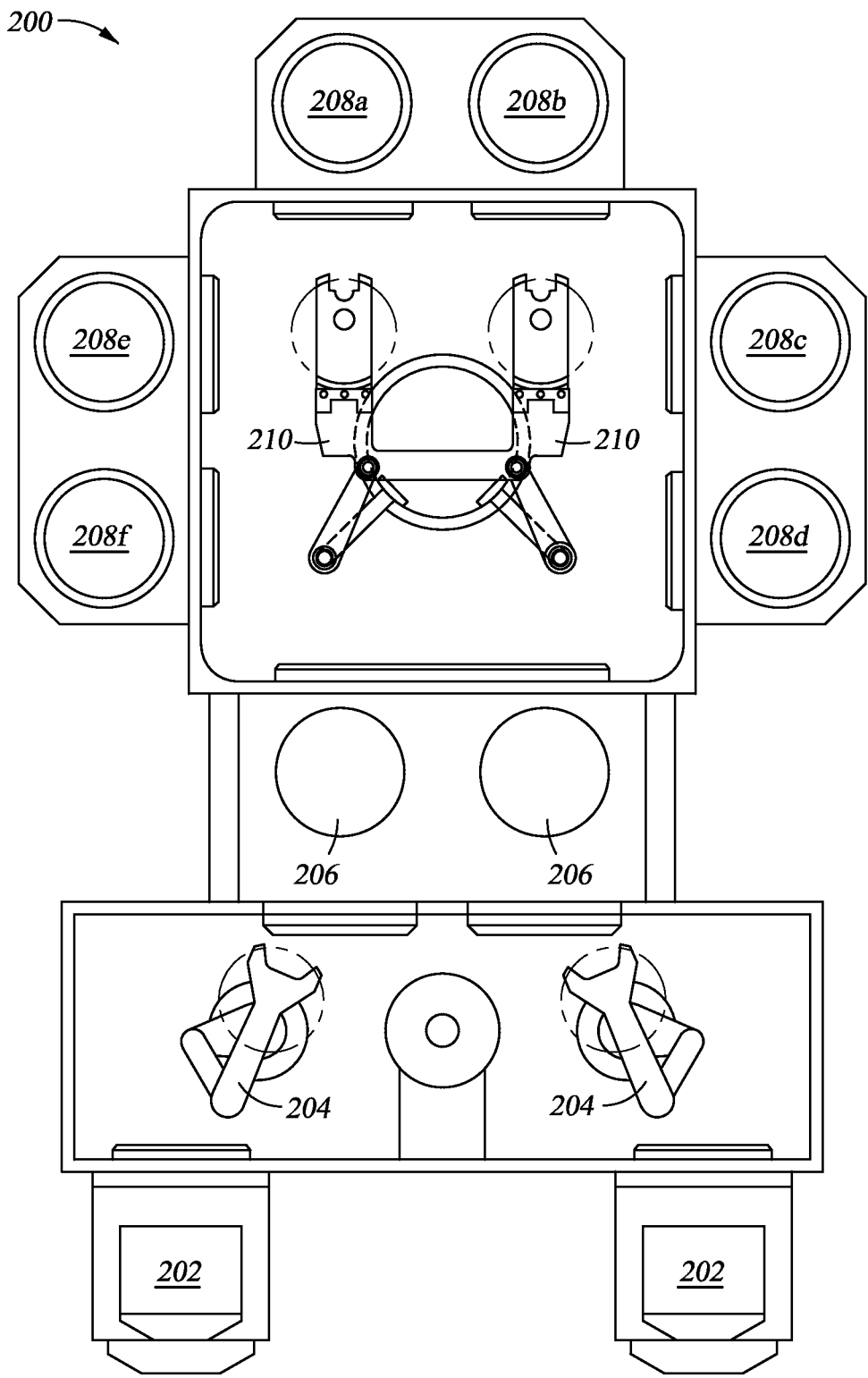
FIG. 2 shows a substrate processing system according to one embodiment.

The method for forming airgaps inside trenches formed on a substrate may be performed by deposition systems such as PRODUCER® plasma enhanced CVD (PECVD) system, available from Applied Materials, Inc. of Santa Clara, Calif. FIG. 2 shows a substrate processing system 200 according to one embodiment. As shown in FIG. 2, a pair of front opening unified pods (FOUPs) 202 supplies substrates that are received by robotic arms 204 and placed into a low pressure holding area 206 before being placed into one of the substrate processing chambers 208a-208f. A second robotic arm 210 may be used to transport the substrates from the holding area 206 to the substrate processing chambers 208a-208f and back.

Substrate processing chambers 208a-208f may include one or more system components for depositing, annealing, curing and/or etching a flowable carbon-containing film such as PMMA film in trenches formed on the substrate. In one configuration, two pairs of the processing chamber (e.g., 208c-208d and 208e-208f) may be used to deposit the flowable carbon-containing film in the trenches, and the third pair of processing chambers (e.g., 208a-208b) may be used to treat the deposited film, such as performing UV treatment.

Figure 3:
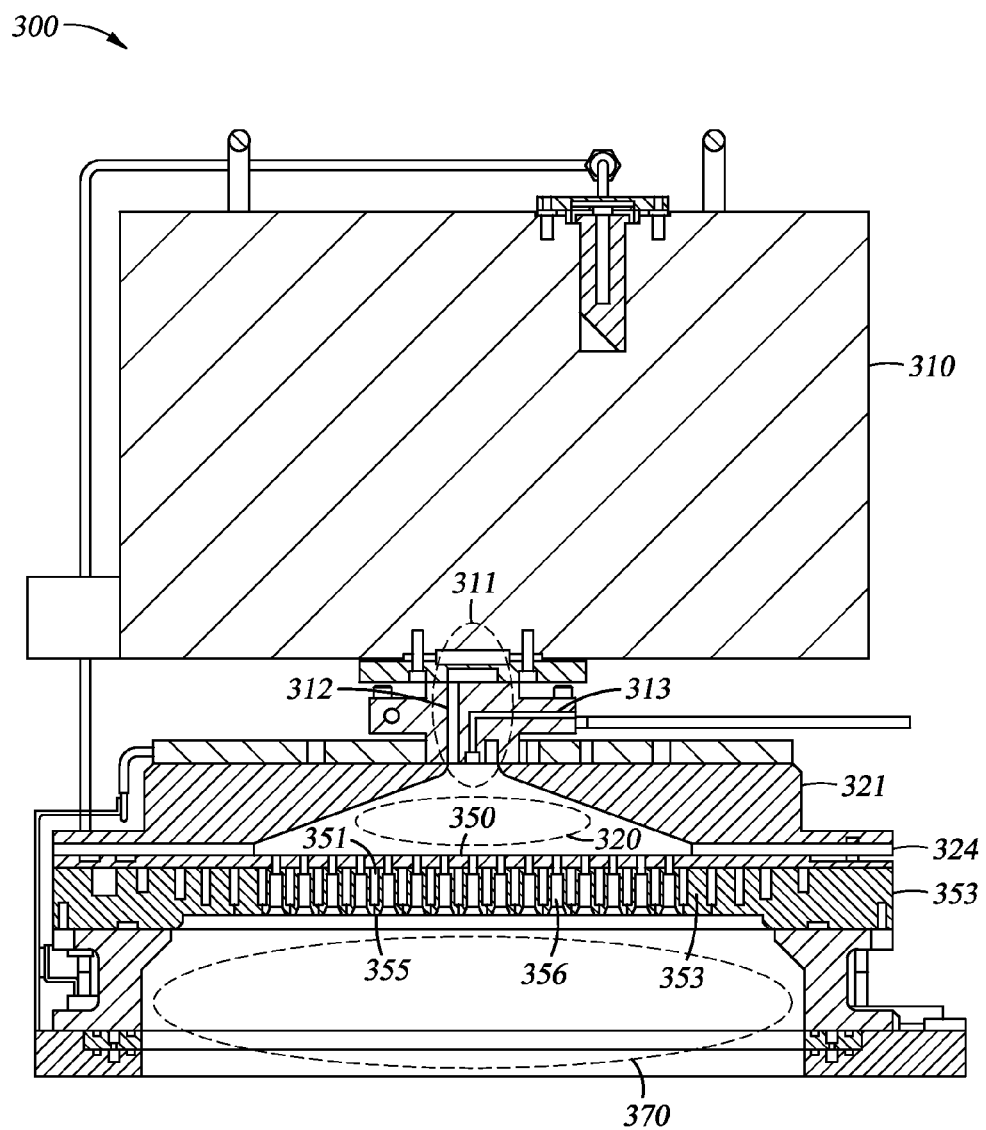
FIG. 3 shows a substrate processing chamber according to one embodiment.

FIG. 3 is a substrate processing chamber 300 according to one embodiment. A remote plasma system 310 may process a gas which then travels through a gas inlet assembly 311. Two distinct gas supply channels are visible within the gas inlet assembly 311. A first channel 312 carries a gas that passes through the remote plasma system 310, which a second channel 313 bypasses the remote plasma system 310. A lid 321 and a showerhead 353 are shown with an insulating ring 324 in between, which allows an AC potential to be applied to the lid 321 relative to showerhead 353. The process gas travels through first channel 312 into a chamber plasma region 320 and may be excited by a plasma in the chamber plasma region 320 alone or in combination with the remote plasma system 310. The combination of the chamber plasma region 320 and/or the remote plasma system 310 may be referred to as a remote plasma system herein. The argon and oxygen-containing gas may be transformed to argon and oxygen-containing plasma effluents by the remote plasma system. The showerhead 353 separates the chamber plasma region 320 from a substrate processing region 370 beneath the showerhead 353. The showerhead 353 allows a plasma present in the chamber plasma region 320 to avoid directly exciting gases in the substrate processing region 370, which still allowing excited species, such as the plasma effluents, to travel from the chamber plasma region 320 into the substrate processing region 370.

The showerhead 353 may be a dual-zone showerhead that allows plasma effluents, such as argon and oxygen-containing plasma effluents created within the plasma region 320 into the substrate processing region 370 by passing through a plurality of throughholes 356 that traverse the thickness of the showerhead 353. Each throughhole 356 may have an opening 350 facing the plasma region 320, and the opening 350 may have a smaller diameter than the diameter of the throughhole 356. The showerhead 353 also has one or more hollow volumes 351 which can be filled with a precursor in the form of a vapor or gas (such as the carbon-containing precursor gas) and pass through small holes 355 into the substrate processing region 370 but not directly into plasma region 320.

The number of throughholes 356 may be between about 60 and about 2000. Throughholes 356 may have a variety of shapes but are mostly easily made round. The diameter of the opening 350 may be between about 0.5 mm and about 20 mm or between about 1 mm and about 6 mm. There is also latitude in choosing the cross-sectional shape of throughholes 356, which may be made conical, cylindrical or a combination of the two shapes. The number of small holes 355 used to introduce a gas into the substrate processing region 370 may be between about 100 and about 5000 or between about 500 and about 2000 in different embodiments. The diameter of the small holes 355 may be between about 0.1 mm and about 2 mm.

While the foregoing is directed to embodiments of the present invention, other and further embodiments of the invention may be devised without departing from the basic scope thereof, and the scope thereof is determined by the claims that follow.

The invention claimed is:

1. A method for forming airgaps in trenches formed on a substrate, comprising:
   forming a flowable carbon-containing film in a first portion of the trenches, comprising:
      providing a carbon-containing gas to a substrate processing region in a chemical vapor deposition chamber;
      providing an oxygen-containing gas to a remote plasma system to form oxygen-containing plasma effluents;
      introducing the plasma effluents into the substrate processing region; and
      reacting the plasma effluents and the carbon-containing gas to form the flowable carbon-containing film in the first portion of the trenches;

forming a low K dielectric material on the flowable carbon-containing film in a second portion of the trenches; and
removing the flowable carbon-containing film to form the airgaps in the first portion of the trenches.

2. The method of claim 1, wherein the carbon-containing gas comprises methyl methacrylate and the flowable carbon-containing film comprises poly(methyl methacrylate), wherein the carbon-containing gas does not contain silicon.

3. The method of claim 2, wherein the oxygen-containing gas comprises oxygen gas and argon gas.

4. The method of claim 3, wherein the methyl methacrylate has a flow rate equivalent to about 400 to 600 sccm for a 300 mm wafer.

5. The method of claim 3, wherein the oxygen gas has a flow rate equivalent to about 100 sccm and the argon gas has a flow rate equivalent to about 1000 to 2000 sccm for a 300 mm wafer.

6. The method of claim 2, wherein the low K dielectric material comprises carbon doped silicon oxide.

7. The method of claim 2, wherein the flowable carbon-containing film is removed by UV treatment.

8. A method for forming airgaps in trenches formed on a substrate, comprising:
    forming a flowable poly(methyl methacrylate) film in a first portion of the trenches, comprising:
        providing a methyl methacrylate gas to a substrate processing region in a chemical vapor deposition chamber;
        forming an argon and oxygen-containing plasma effluents in a plasma region distinct from the substrate processing region in the chemical vapor deposition chamber;
        introducing the plasma effluents into the substrate processing region; and
        reacting the plasma effluents and the methyl methacrylate gas to form the flowable poly(methyl methacrylate) film in the first portion of the trenches;
    and
    removing the flowable poly(methyl methacrylate) film to form the airgaps in the first portion of the trenches.

9. The method of claim 8, wherein forming the argon and oxygen-containing plasma effluents comprises flowing oxygen gas and argon gas to a remote plasma system.

10. The method of claim 9, wherein the oxygen gas has a flow rate equivalent to about 100 sccm and the argon gas has a flow rate equivalent to about 1000 to 2000 sccm for a 300 mm wafer.

11. The method of claim 8, wherein the methyl methacrylate gas has a flow rate equivalent to about 400 to 600 sccm for a 300 mm wafer.

12. The method of claim 8, further comprising forming a low K dielectric material on the flowable poly(methyl methacrylate) film in a second portion of the trenches.

13. The method of claim 12, wherein the low K dielectric material comprises carbon doped silicon oxide.

14. The method of claim 8, wherein the flowable carbon-containing film is removed by UV treatment.

15. A method for forming airgaps in trenches formed on a substrate, comprising:
    forming a flowable carbon-containing film in a first portion of the trenches, comprising:
        providing a carbon-containing gas to a substrate processing region in a chemical vapor deposition chamber, wherein the carbon-containing gas does not contain silicon;
        providing an oxygen-containing gas to a remote plasma system to form oxygen-containing plasma effluents;
        introducing the plasma effluents into the substrate processing region; and
        reacting the plasma effluents and the carbon-containing gas to form the flowable carbon-containing film in the first portion of the trenches;
    forming a low K dielectric material on the flowable carbon-containing film in a second portion of the trenches; and
    removing the flowable carbon-containing film to form the airgaps in the first portion of the trenches.

16. The method of claim 15, wherein the carbon-containing gas comprises methyl methacrylate.

17. The method of claim 15, wherein the flowable carbon-containing film comprises poly(methyl methacrylate).

18. The method of claim 15, wherein the carbon-containing gas has a flow rate equivalent to about 400 to 600 sccm for a 300 mm wafer.

19. The method of claim 15, wherein the oxygen-containing gas comprises oxygen gas and argon gas.

20. The method of claim 19, wherein the oxygen gas has a flow rate equivalent to about 100 sccm and the argon gas has a flow rate equivalent to about 1000 to 2000 sccm for a 300 mm wafer.

* * * * *